(12) United States Patent
Kamigaichi

(10) Patent No.: US 8,885,411 B2
(45) Date of Patent: Nov. 11, 2014

(54) NONVOLATILE SEMICONDUCTOR MEMORY DEVICE

(71) Applicant: Kabushiki Kaisha Toshiba, Minato-ku (JP)

(72) Inventor: Takeshi Kamigaichi, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/022,840

(22) Filed: Sep. 10, 2013

(65) Prior Publication Data

US 2014/0269079 A1    Sep. 18, 2014

Related U.S. Application Data

(60) Provisional application No. 61/794,476, filed on Mar. 15, 2013.

(51) Int. Cl.
  *G11C 16/04*    (2006.01)
  *G11C 16/10*    (2006.01)

(52) U.S. Cl.
  CPC ...................................... *G11C 16/10* (2013.01)
  USPC ............ 365/185.17; 365/185.19; 365/185.22; 365/185.28

(58) Field of Classification Search
  CPC ... G11C 16/10; G11C 16/107; G11C 16/0483
  USPC .............. 365/185.17, 185.19, 185.22, 185.28
  See application file for complete search history.

(56) References Cited

U.S. PATENT DOCUMENTS

| 7,239,556 B2 | 7/2007 | Abe et al. | |
|---|---|---|---|
| 7,301,815 B2 | 11/2007 | Kurata et al. | |
| 7,630,251 B2 | 12/2009 | Hosono | |
| 8,199,579 B2 | 6/2012 | Shiino et al. | |
| 2009/0238002 A1* | 9/2009 | Wong et al. | 365/185.17 |
| 2011/0199827 A1* | 8/2011 | Puzzilli et al. | 365/185.14 |
| 2012/0069669 A1 | 3/2012 | Sakamoto et al. | |
| 2012/0176836 A1* | 7/2012 | Iguchi et al. | 365/185.2 |

FOREIGN PATENT DOCUMENTS

| JP | 2006-59481 | 3/2006 |
|---|---|---|
| JP | 2008-140488 | 6/2008 |
| JP | 4398750 B2 | 10/2009 |
| JP | 2012/69193 | 4/2012 |
| JP | 5039105 B2 | 7/2012 |

* cited by examiner

*Primary Examiner* — Hoai V Ho
(74) *Attorney, Agent, or Firm* — Oblon, Spivak, McClelland, Maier & Neustadt, L.L.P.

(57) ABSTRACT

A nonvolatile semiconductor memory device according to an embodiment includes a memory cell array that includes NAND cell units; and a write/erase circuit configured to execute a select gate write operation, the select gate write operation executing a programming operation for setting a threshold voltage of a drain side select gate and a verify operation for judging whether said threshold voltage has reached a certain value, and, when it is judged by the verify operation on the drain side select gate that the threshold voltage of the drain side select gate has not reached the certain value, repeatedly executing a programming operation for setting a threshold voltage of a drain side dummy cell connected to the drain side select gate and a verify operation for judging whether said threshold voltage has reached a certain value, until the threshold voltage of the drain side dummy cell has reached the certain value.

20 Claims, 11 Drawing Sheets

NONVOLATILE SEMICONDUCTOR MEMORY DEVICE

CROSS-REFERENCE TO RELATED APPLICATIONS

This application is based upon and claims the benefit of priority from the prior U.S. Provisional Application 61/794,476, filed on Mar. 15, 2013, the entire contents of which are incorporated herein by reference.

BACKGROUND

1. Field

Embodiments of the present invention relate to a nonvolatile semiconductor memory device.

2. Description of the Related Art

Along with miniaturization of NAND type flash memory, advances are being made in the study, commercial realization, and so on, of a memory cell of planar surface structure including a charge storage layer of a floating gate, or the like, thinned to 5 nm or less. However, because it is difficult in such a case to short-circuit only the control gate and the charge storage layer, consideration is being given to also configuring the select gate by a transistor having a structure including a charge storage layer similarly to the memory cell. Generally, when a similar structure is adopted for the select gate and the memory cell, it is often the case that the flash memory is provided with a write/erase function to the select gate and a threshold voltage of the select gate set. However, along with miniaturization of the flash memory, variation in the threshold voltage of the select gate after write also increases. In this case, it is easy for excessive write, deficient write, or the like, to occur, depending on a NAND cell unit, whereby reliability of the flash memory is impaired.

DETAILED DESCRIPTION

A nonvolatile semiconductor memory device according to an embodiment comprises: a memory cell array including a source line, a plurality of bit lines, and a plurality of NAND cell units, the plurality of NAND cell units being each configured from a source side select gate, a plurality of memory cells, a drain side dummy cell, and a drain side select gate that are connected in series between the source line and the bit line, and the source side select gate, the plurality of memory cells, the drain side dummy cell, and the drain side select gate being each a transistor that has a control gate and a charge storage layer; and a write/erase circuit configured to execute a select gate write operation, the select gate write operation executing a programming operation for setting a threshold voltage of the drain side select gate and a verify operation for judging whether said threshold voltage has reached a certain value, and, when it is judged by the verify operation on the drain side select gate that the threshold voltage of said drain side select gate has not reached the certain value, repeatedly executing a programming operation for setting a threshold voltage of the drain side dummy cell connected to said drain side select gate and a verify operation for judging whether said threshold voltage has reached a certain value, until the threshold voltage of said drain side dummy cell has reached the certain value.

A nonvolatile semiconductor memory device according to embodiments is described below with reference to the drawings.

First Embodiment

First, an overall configuration of a NAND type flash memory (below, referred to simply as "flash memory") serving as an example of a nonvolatile semiconductor memory device according to a first embodiment is described.

Figure 1:
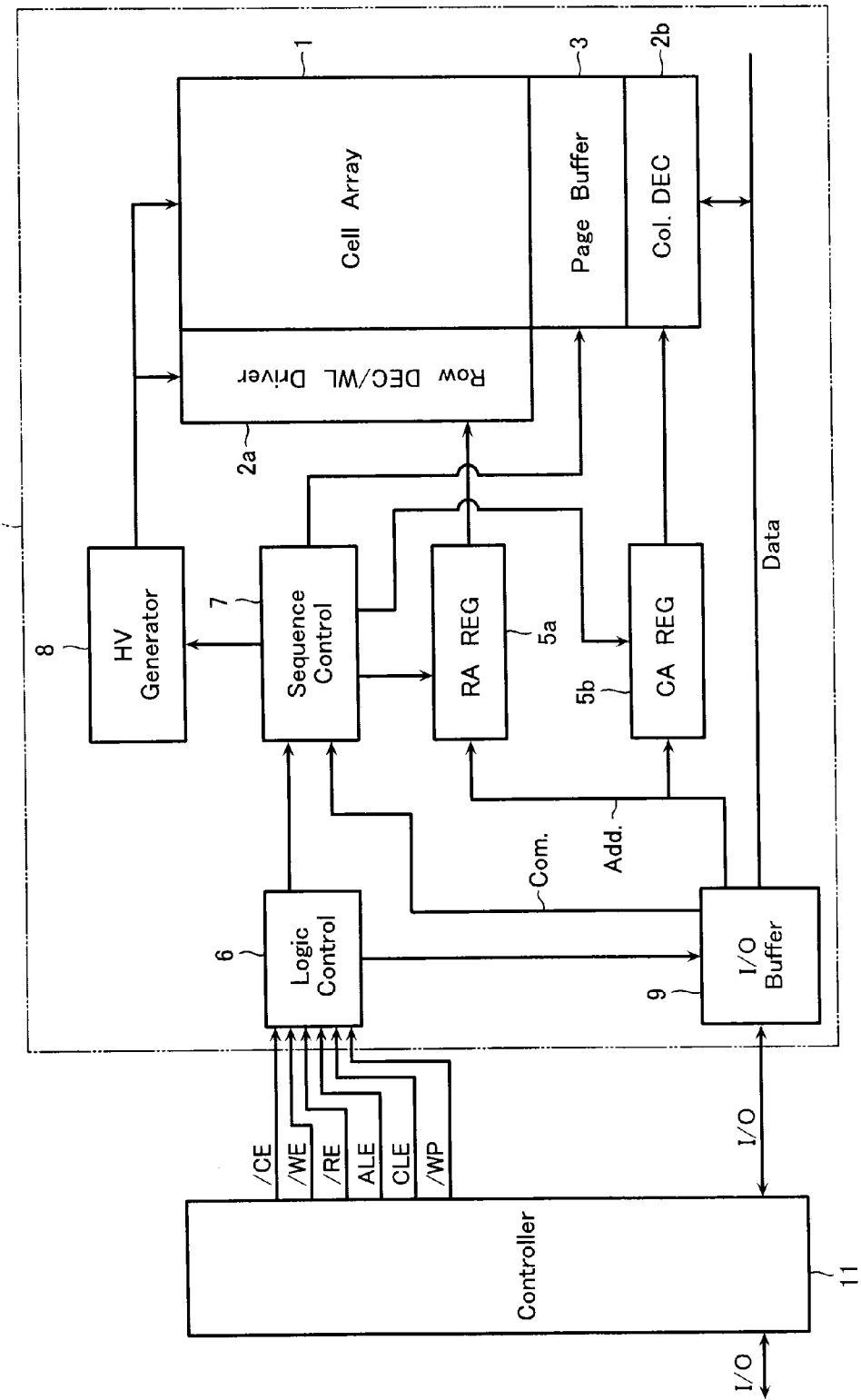
FIG. 1 is a view showing an overall configuration of a nonvolatile semiconductor memory device according to a first embodiment.

FIG. 1 is a view showing the overall configuration of the flash memory according to the present embodiment.

The flash memory comprises a NAND chip 10 and a controller 11 for controlling NAND chip 10. The NAND chip 10 comprises a memory cell array 1, a row decoder/word line driver 2a and column decoder 2b, a page buffer 3, a row address (RA) register 5a and column address (CA) register 5b, a logic control circuit 6, a sequence control circuit 7, a high voltage generating circuit 8, and an I/O buffer 9. Note that the row decoder/word line driver 2a and column decoder 2b and the page buffer 3 are included in a write/erase circuit.

The memory cell array 1 comprises a bit line, a word line, a select gate line, and a plurality of memory cells selected by the bit line, word line, and select gate line. The memory cell is configured from a transistor having a floating gate which is a charge storage layer. Note that, in addition, the present embodiment may be also applied to a transistor having a MONOS structure.

The row decoder/word line driver 2a drives the word line and the select gate line of the memory cell array 1. The page buffer 3 includes a one page portion sense amplifier and data holding circuit, and performs read and write of data in the memory cell array 1 in page units. A one page portion of read data of the page buffer 3 is sequentially column selected by the column decoder 2b to be outputted to an external I/O terminal via the I/O buffer 9. Write data supplied from the I/O terminal is selected one page at a time by the column decoder 2b to be loaded into the page buffer 3. A row address signal and a column address signal are inputted via the I/O buffer 9 to be transferred to the row decoder/word line driver 2a and the column decoder 2b, respectively.

The row address register 5a holds an erase block address during an erase operation, and holds a page address during a write operation and a read operation. The column address register 5b receives input of a lead column address required in loading of write data before start of a write operation or a lead column address required in a read operation. The column address register 5b holds an inputted column address until a write enable signal/WE or a read enable signal/RE are toggled under a certain condition.

The logic control circuit 6 controls input of a command or address and input/output of data, based on control signals such as a chip enable signal/CE, a command enable signal CLE, an address latch enable signal ALE, the write enable signal/WE, the read enable signal/RE, and so on.

The sequence control circuit 7 receives a command from the logic control circuit 6 to control the erase operation, the read operation, or the write operation. That is, the sequence control circuit 7 controls the erase operation, the read operation, or the write operation by controlling the row address register 5a, the column address register 5b, the row decoder/word line driver 2a, and so on.

The high voltage generating circuit 8 is controlled by the sequence control circuit 7 to generate a certain voltage required in various kinds of operations.

The controller 11 executes control of write and read of data under conditions appropriate to a current write state of the NAND chip 10.

Next, the memory cell array 1 is described.

Figure 2:
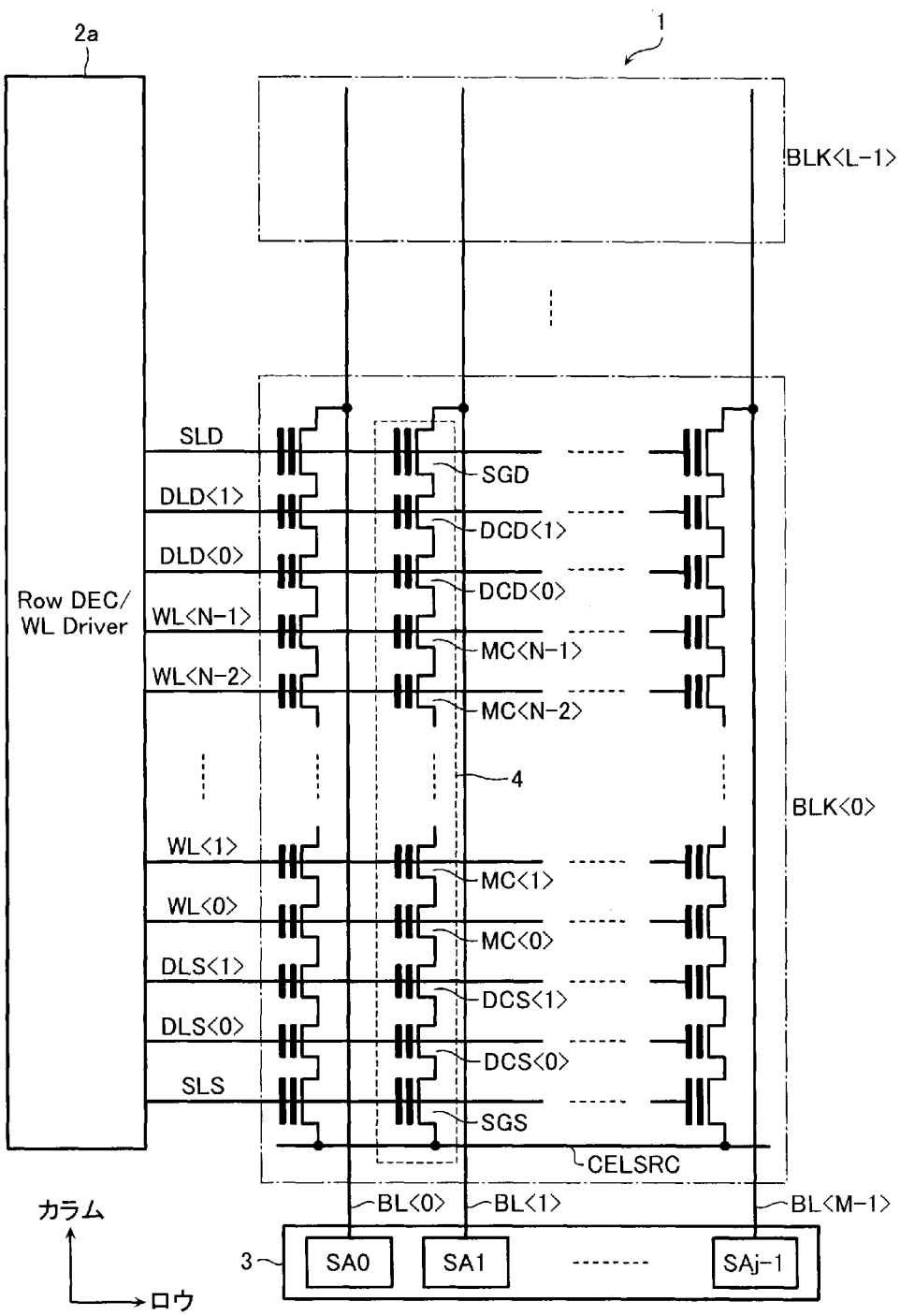
FIG. 2 is a view showing a configuration of a memory cell array and peripheral circuits in the nonvolatile semiconductor memory device according to the same embodiment.

FIG. 2 is a view showing a configuration of the memory cell array 1 and peripheral circuits in the flash memory according to the present embodiment.

The memory cell array 1 includes, extending in a row direction, a source line CELSRC, a source side select gate line SLS, two source side dummy word lines DLS<0:1>, N word lines WL<0:N−1>, two drain side dummy word lines DLD<0:1>, and a drain side select gate line SLD, and, extending in a column direction, M bit lines BL<0:M−1>. Connected between the source line CELSRC and each of the bit lines BL<0:M−1> is a NAND cell unit 4. The NAND cell unit 4 includes, connected in series from the source line CELSRC to the bit line BL, a source side select gate SGS, two source side dummy cells DCS<0:1>, N memory cells MC<0:N−1>, two drain side dummy cells DCD<0:1>, and a drain side select gate SGD. Note that in the description of the present embodiment, there are two each of each of the source side dummy word lines DLS, the drain side dummy word lines DLD, the source side dummy cells DCS, and the drain side dummy cells DCD, but the present embodiment can be applied provided there is at least one of each of these.

Now, the select gates SGS and SGD, the dummy cells DCS<0:1> and DCD<0:1>, and the memory cells MC<0:N−1> each have a so-called planar surface cell structure configured from a transistor comprising a thin film floating gate of thickness 5 nm or less. Normally, a transistor that is to be a select gate has a through hole formed in a gate insulating film between the control gate and the floating gate. Doing so causes the control gate and the floating gate to be electrically conducting, thereby allowing the transistor to be employed similarly to an ordinary FET. However, when the floating gate is thin film as in the select gates SGS and SGD of the present embodiment, a through hole cannot be formed easily in the gate insulating film due to the danger of destroying the floating gate. Therefore, when a select gate having a planar surface cell structure is employed, an appropriate threshold voltage is set by programming the select gate, after which on/off control is performed by a gate voltage, similarly to the case of a memory cell. In the present embodiment, the select gates SGS and SGD are assumed to have such a planar surface cell structure.

The source side select gate line SLS, the source side dummy word lines DLS<0:1>, the word lines WL<0:N−1>, the drain side dummy word lines DLD<0:1>, and the drain side select gate line SLD are commonly connected to gates of the source side select gate SGS, the source side dummy cells DCS<0:1>, the memory cells MC<0:N−1>, the drain side dummy cells DCD<0:1>, and the drain side select gate SGD, respectively, in the M NAND cell units 4.

Now, the dummy word lines DLS<0:1> and DLD<0:1> and the dummy cells DCS<0:1> and DCD<0:1> have a similar structure to the word lines WL<n> (n=0~N−1) and the memory cells MC<n>. Providing the dummy cells DCS<0:1> and DCD<0:1> in the NAND cell unit 4 enables effects of gate induced drain leak current received from the select gates SGS and SGD to be relieved, whereby disturb tolerance of the memory cells MC<0,N−1> disposed at both ends can be improved.

A range of the M memory cells MC<n> commonly connected to one word line WL<n> (n=0~N−1) configures a page which is the unit of read or write of batch data. Moreover, a range of the M NAND cell units aligned in the row direction configures a cell block BLK which is the unit of batch erase of data. In the case of the memory cell array 1 shown in FIG. 2, L cell blocks BLK<0:L−1> sharing the bit lines BL<0:M−1> are arranged in the column direction.

In addition, connected to one of the ends of the select gate lines SLS and SLD, the dummy word lines DLS<0:1> and DLD<0:1>, and the word lines WL<0:N−1> is the row decoder/word line driver 2a. The select gate lines SLS and SLD, the dummy word lines DLS<0:1> and DLD<0:1>, and the word lines WL<0:N−1> are driven by the row decoder/word line driver 2a. Moreover, connected to one of the ends of the bit lines BL<0:M−1> are sense amplifiers SA<0:M−1>, respectively, of the page buffer 3.

Next, a correspondence between a threshold voltage distribution and data of the memory cell MC is described.

Figure 3A:
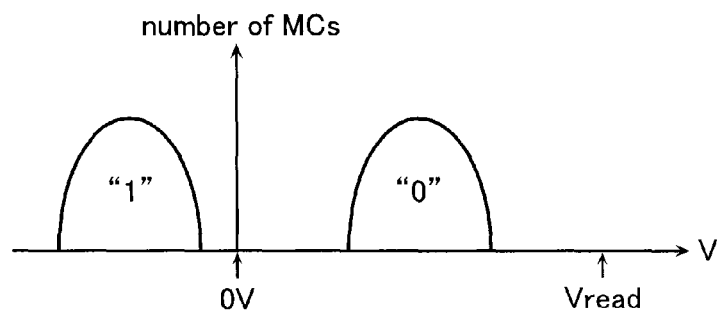
FIG. 3A is a view showing a threshold voltage distribution of a binary storage memory cell in the nonvolatile semiconductor memory device according to the same embodiment.
Figure 3B:
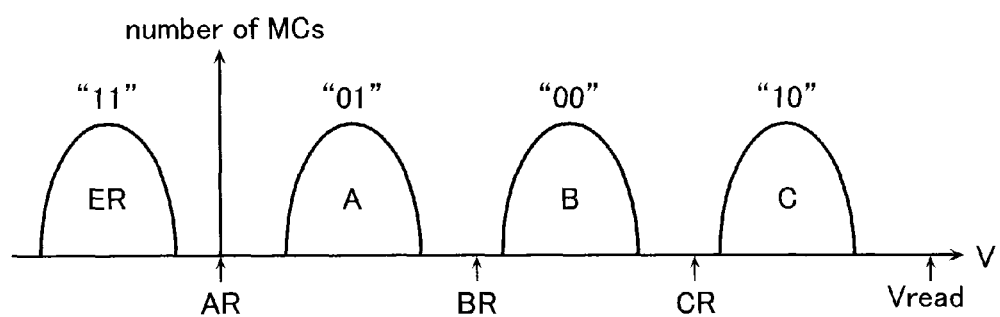
FIG. 3B is a view showing a threshold voltage distribution of a four-level storage memory cell in the nonvolatile semiconductor memory device according to the same embodiment.

FIGS. 3A and 3B are views showing a threshold voltage distribution of the memory cell in the flash memory according to the present embodiment.

In the memory cell MC, several threshold voltage distributions are set in advance, and data is stored according to which distribution the threshold voltage of the memory cell MC belongs to.

For example, in the case where two-level data (one bit per cell) is stored in the memory cell MC, the threshold voltage distributions corresponding to each data are as shown in FIG. 3A. A state where the threshold voltage is negative is data "1" (erase state), and a state where the threshold voltage is positive is data "0". Moreover, in the case where four-level data (two bits per cell) is stored in the memory cell MC, threshold voltage distributions ER, A, B, and C corresponding to each data are provided. Four types of data "11", "01", "00", and "10" are allocated to these threshold voltage distributions. Now, the threshold voltage distribution ER is a negative threshold voltage state obtained by a block erase operation on the cell block BLK.

Next, the read operation, the write operation, and the erase operation of data of the memory cell MC are described. Note that the read operation and the write operation described herein assume that an appropriate threshold voltage is set in the select gates SGS and SGD.

In the data read operation of the flash memory, an unselected word line WL in the memory cell array 1 is applied with a read voltage Vread at which an unselected memory cell MC is conducting regardless of data. The dummy word lines DLS and DLD are applied with the read voltage Vread at which the dummy cells DCS and DCD are conducting. Moreover, the select gate lines SLS and SLD are applied with select gate voltages Vsgs and Vsgd at which the select gates SGS and SGD are conducting.

Then, during a binary data read operation, a selected word line WL connected to a selected memory cell MC is applied with a voltage between the two threshold voltage distributions (for example, a voltage 0 V). With this voltage application, whether a current flows in the NAND cell unit 4 can be detected, whereby data read is executed. On the other hand, during a four-level data read operation, a value of the voltage applied to the selected word line WL is set, corresponding to the four types of threshold voltage distributions of the selected memory cell MC, to a voltage AR, BR, or CR between each of the threshold voltage distributions. The voltage AR is the lowest voltage, and voltage values increase in order of BR and CR. In the four-level data read operation, data read is executed by detecting whether a current flows in the NAND cell unit 4 at each of voltages AR, BR, and CR.

During a write operation of data "0", the selected word line WL is applied with a write voltage Vpgm (for example, 15 V~20 V). Moreover, the bit line BL is provided with a ground voltage Vss, which is transferred to a channel of the selected memory cell MC (below, referred to as "cell channel") via the conducting-rendered drain side select gate SGD. At this time, a large electric field is applied between the floating gate and the cell channel in the selected memory cell MC, whereby electrons are injected from the cell channel into the floating gate by FN tunneling. In the case of multi-level data storage, the number of times of applications of the write voltage Vpgm is changed to adjust the amount of electrons injected into the floating gate, thereby enabling a plurality of threshold voltage distributions to be provided.

During a write operation of data "1" (non-write), the bit line BL is provided with a back bias voltage Vdd (for example, 2.5 V), which is transferred to the cell channel of the selected memory cell MC via the conducting-rendered drain side select gate SGD. After the cell channel has been charged to a voltage Vdd-Vth (Vth is the threshold voltage of the select gate), the select gates SGS and SGD become non-conducting, whereby the cell channel is set to a floating state. In this case, even if the selected word line WL is applied with the write voltage Vpgm, the cell channel undergoes a rise in potential due to capacitive coupling with the selected word line WL, with the result that electrons are not injected into the floating gate. As a result, the memory cell MC keeps data "1".

The erase operation of data in the flash memory is executed in cell block BLK units. The erase operation is performed by setting all the word lines WL including the dummy word lines DLS and DLD in a selected cell block BLK to 0 V, and applying a positive boosted erase voltage Vera (for example, 18 V~20 V) to a P type well where the memory cell array 1 is formed. As a result, a negative threshold voltage state (erase state) where electrons of the floating gate are discharged is obtained in all memory cells MC of the selected cell block BLK. After this, an erase verify operation is performed as required. The erase verify operation is performed as an operation for checking whether all the memory cells MC of the NAND cell unit 4 have been erased to a negative threshold voltage or not. Specifically, the erase verify operation provides a certain voltage (for example, 0 V) to all word lines WL and detects whether a current flows in the NAND cell unit 4 or not.

Next, threshold voltage setting in the select gates SGS and SGD is described.

The select gates SGS and SGD have a planar surface cell structure similar to that of the memory cell MC. Therefore, basically, the threshold voltage of the select gates SGS and SGD can be set by creating in the memory cell array 1 a similar bias state to that in the previously mentioned read operation, write operation, and erase operation on the memory cells MC. However, in the case of threshold voltage setting in the select gates SGS and SGD, some ingenuity is required, since the select gates SGS and SGD do not operate normally before the select gates having appropriate threshold voltages. This is contrary to during the likes of the read operation of the memory cells MC after the threshold voltage of the select gates is setting up.

The threshold voltage of the select gates SGS and SGD is set by executing a later described select gate write operation after execution of the erase operation on the cell block BLK.

First, the erase operation is executed. Now, the select gate lines SLS and SLD, all the dummy word lines DLS and DLD, and all the word lines WL in the selected cell block BLK are applied with 0 V, and the P type well where the memory cell array 1 is formed is applied with the erase voltage Vera. As a result, an erase state where electrons of the floating gate in the select gates SGS and SGD of the selected cell block BLK are discharged is obtained.

Following this, the select gate write operation is executed.

Figure 4:
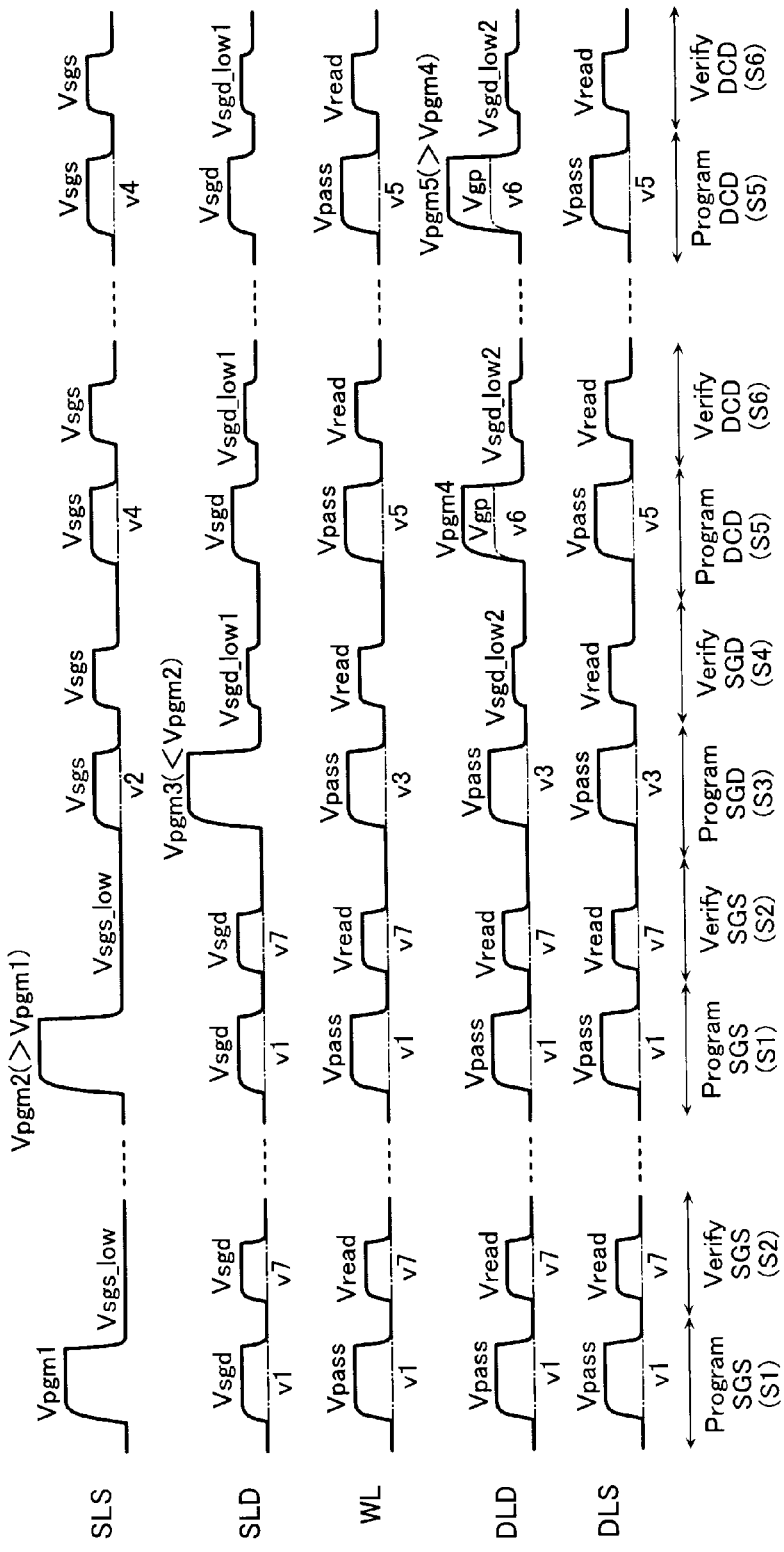
FIG. 4 is a view showing an operation waveform during a select gate write operation in the nonvolatile semiconductor memory device according to the same embodiment.

FIG. 4 is a view showing an operation waveform during the select gate write operation in the flash memory according to the present embodiment.

The select gate write operation refers to a series of operations configured from at least one time of a programming operation (step S1 shown in FIG. 4) and a verify operation (step S2 shown in FIG. 4) on the source side select gate SGS, a programming operation (step S3 shown in FIG. 4) and a verify operation (step S4 shown in FIG. 4) on the drain side select gate SGD, and a programming operation (step S5 shown in FIG. 4) and a verify operation (step S6 shown in FIG. 4) on the drain side dummy cell DCD<1>. Now, programming refers to causing electrons to be injected into the floating gate of a transistor, thereby causing the threshold voltage of the transistor to undergo transition to a positive side. Moreover, verify refers to judging the threshold voltage of the transistor.

Steps S1 and S2 are configured to keep the threshold voltage of the source side select gate SGS within a comparatively broad range of from Vsgs_low (for example, 0 V) to Vsgs (for example, 4 V). In the case of the source side select gate SGS, margin of the threshold voltage can be set broadly, since, in the read operation and the write operation of the memory cell MC, there is only control of whether to render conducting or to render non-conducting all the source side select gates SGS of the cell block BLK in a batch.

First, in the programming operation on the source side select gate SGS of step S1, the source side select gate line SLS is applied with the write voltage Vpgm (Vpgm1 shown in FIG. 4), and all the dummy word lines DLS and DLD, all the word lines WL, and the drain side select gate SGD are applied with a pass voltage Vpass at which all the dummy cells DCS and DCD, all the memory cells MC, and the drain side select gate SGD are conducting. This causes electrons to be injected into the floating gate of the source side select gate SGS from the bit line BL via the dummy cells DCS and DCD, the memory cells MC, and the drain side select gate SGD. As a result, the threshold voltage of the source side select gate SGS undergoes a transition to the positive side.

Note that the pass voltage Vpass applied to the dummy word lines DLS and so on need only be a voltage at which the dummy cells DCS and so on are conducting, hence is not required to be a positive voltage. Considering that before execution of step S1, the erase operation has been executed, causing the threshold voltage of the dummy cells DCS and so on to be at a negative voltage, then the dummy cells DCS and so on can be rendered conducting even by simply applying 0 V to the dummy word lines DLS and so on as shown by the dashed-dotted line v1 in FIG. 4, for example.

However, given that due to some kind of defect, the dummy cells DCS and so on may not have been perfectly erased, then the dummy cells DCS and so on can be rendered conducting more reliably by the dummy word lines DLS and so on being applied in advance with the somewhat high pass voltage Vpass.

Moreover, when the possibility that the dummy cells DCS and so on are not conducting is also considered, then the source line CELSRC need only be charged to the ground voltage Vss in advance. This allows electrons to be injected into the floating gate of the source side select gate SGS from the source line CELSRC, even if the dummy cells DCS and so on are not conducting.

Following this, in the verify operation on the source side select gate SGS of step S2, the source side select gate line SLS is applied with a lower limit voltage Vsgs_low corresponding to a lower limit of the threshold voltage distribution of the source side select gate SGS, and all the dummy word lines DLS and DLD and all the word lines WL are applied with the read voltage Vread, and the drain side select gate SGD is applied with a select gate voltage Vsgd. Then, detection of whether a current flows in the NAND cell unit 4 or not is performed by the sense amplifier SA to execute data read.

Note that, similarly to step S1, the read voltage Vread or Vsgd applied to the dummy word lines DLS and so on need only be a voltage at which the dummy cells DCS and so on are conducting, hence is not required to be a positive voltage. The dummy cells DCS and so on can be rendered conducting even by simply applying 0 V to the dummy word lines DLS and so on as shown by the dashed-dotted line v7 in FIG. 4, for example.

Figure 5:
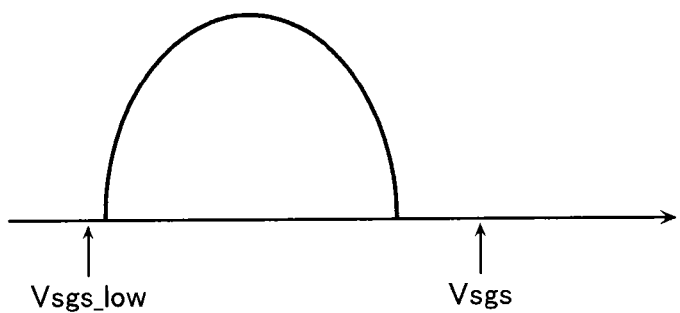
FIG. 5 is a view showing a threshold voltage distribution of a source side select gate in the nonvolatile semiconductor memory device according to the same embodiment.

Now, if there is even one source side select gate SGS having a threshold voltage that falls below the lower limit voltage Vsgs_low, then, as shown in FIG. 4, steps S1 and S2 are repeated again after stepping up the write voltage Vpgm. This case results in an unnecessary programming being executed even on the source side select gate SGS already having a threshold voltage of at least Vsgs_low, but, as mentioned previously, the margin of the threshold voltage of the source side select gate SGS is comparatively broad, hence, as shown in FIG. 5, the threshold voltage of all the source side select gates SGS can be kept within a range of from Vsgs_low to Vsgs.

In steps S3 and S4, the threshold voltage of the drain side select gate SGD is written up from a comparatively narrow Vsgd_low (for example, 0.5 V) to Vsgd (for example, 2 V).

First, in the programming operation on the drain side select gate SGD of step S3, the drain side select gate line SLD is applied with the write voltage Vpgm (Vpgm3 shown in FIG. 4), and the source side select gate line SLS is applied with a select gate voltage Vsgs, and all the dummy word lines DLS and DLD and all the word lines WL are applied with the pass voltage Vpass. In addition, the source line CELSRC and the bit line BL are charged to 0 V. This causes electrons to be injected into the floating gate of the drain side select gate SGD from the bit line BL directly or from the source line CELSRC via the source side select gate SGS, all the dummy cells DCS and DCD, and all the word lines WL. As a result, the threshold voltage of the drain side select gate SGD undergoes a transition to the positive side.

Note that because electrons are injected into the floating gate of the drain side select gate SGD from the bit line BL as described above, it is not necessarily required to render conducting the source side select gate SGS. As shown by the dashed-dotted line v2 in FIG. 4, the source side select gate line SLS may be applied with a voltage lower than the threshold voltage of the source side select gate SGS, for example, a voltage of 0 V, whereby the source side select gate is rendered non-conducting. In this case, since the source line CELSRC becomes electrically disconnected from the bit line BL and capacitance of the source line CELSRC can no longer be seen, it becomes easier for electron injection to the floating gate of the drain side select gate SGD to be performed. In addition, the effort of charging the source line CELSRC to 0 V can be saved.

Moreover, in step S3, it is also possible, based on the write voltage Vpgm2 last applied to the source side select gate line SLS in step S1, for the drain side select gate line SLD to be applied with a write voltage Vpgm3 which is lower than said write voltage Vpgm2. Since the drain side select gate SGD has the same structure as the source side select gate SGS, write characteristics of the two are similar to each other. In other words, employing the write voltage Vpgm3 which is lower than the write voltage Vpgm2 last applied to the source side select gate line SLS makes it possible to avoid an over-writing-up of the threshold voltage of the drain side select gate due to application of an excessive write voltage Vpgm.

Moreover, in step 3 too, similarly to step S1, as shown by the dashed-dotted line v3 in FIG. 4, all the dummy word lines DLS and DLD and all the word lines WL may be applied with a voltage higher than the threshold voltage of the erase state of all the dummy cells DCS and DCD and all the memory cells MC, for example, a voltage of 0 V. This is because at this time point of step S3, the threshold voltage of all the dummy cells DCS and DCD and all the memory cells MC is still the erase state and the dummy cells DCS and so on can be rendered conducting even if the gate voltage is 0 V. However, it should be noted that here too, similarly to in step S1, the dummy cells DCS and so on can be rendered conducting more reliably by the dummy word lines DLS and so on being applied with the pass voltage Vpass.

Following this, in the verify operation on the drain side select gate SGD of step S4, the drain side select gate line SLD and the drain side dummy word line DLD<1> are applied with a lower limit voltage Vsgd_low (Vsgd_low1 and Vsgd_low2, respectively, shown in FIG. 4) corresponding to a lower limit of the threshold voltage distribution of the drain side select gate SGD, and the source side select gate SGS is applied with the select gate voltage Vsgs, and all the source side dummy word lines DLS, all the word lines WL, and the drain side dummy word line DLD<0> are applied with the read voltage Vread. Then, detection of whether a current flows in the NAND cell unit 4 or not is performed by the sense amplifier SA.

Although steps S3 and S4 described above may also be executed repeatedly similarly to steps S1 and S2, it is sufficient for steps S3 and S4 to be performed one time, even if there is a drain side select gate SGD having a threshold voltage that falls below the lower limit voltage Vsgd_low.

As touched on above, the drain side select gate SGD has a margin of threshold voltage which is narrower than that of the source side select gate SGS. This is because in the case of the drain side select gate SGD, contrary to the source side select gate SGS, it is required during the write operation to switch conducting/non-conducting for each NAND cell unit 4 depending on the need or otherwise of programming the memory cells MC. As a result, it sometimes happens that the threshold voltage of some of the drain side select gates SGD is not kept to a desired value. It is assumed that an upper skirt of the threshold voltage distribution of the drain side select gate SGD has ended up exceeding an upper limit value (for example, select gate voltage Vsgd=2.5 V). In this case, even if, in order to write data "0", the drain side select gate line SLD is applied with the select gate voltage Vsgd, the threshold voltage is higher than the select gate voltage Vsgd, hence the drain side select gate SGD is not sufficiently conducting. As a result, the cell channel of the selected memory cell MC cannot be kept at 0 V (GND), and electrons cannot be sufficiently injected into the floating gate of the selected memory cell MC. In other words, this is a cause of write deficiency occurring. Conversely, it is assumed that a lower skirt of the threshold voltage distribution of the drain side select gate SGD has fallen below a lower limit value (for example, 0 V). In this case, even if it is desired to perform non-write (write of data "1"), it becomes impossible to hold a potential of the cell channel of the selected memory cell MC, hence a mistaken write of data "0" occurs.

It is clear from the above that the threshold voltage distribution of the drain side select gate SGD is preferably configured more narrowly than the threshold voltage distribution of the source side select gate SGS. However, normally, the drain side select gate SGD has a similar structure to that of the source side select gate SGS, hence the source side select gate SGS and the drain side select gate SGD in the same individual body end up with the same level of threshold distribution width. Moreover, contrary to a select gate that employs a transistor not having a floating gate or that employs a transistor having a through hole formed in an inter-gate insulating film, and so on, the effect of variation-causing elements, such as characteristics of the floating gate or gate insulating film, and so on, is great. Furthermore, in the case of the select gates SGS and SGD, precise programming is not possible either, because, unlike in a write operation on the memory cell MC, the select gates SGS and SGD cannot be employed.

Moreover, because the select gates SGS and SGD cannot be employed, programming on the drain side select gate SGD must target all the drain side select gates SGD in a cell block BLK. As a result, when programming is further executed in order to rescue a drain side select gate SGD having a threshold voltage that falls below the lower limit value, the threshold voltage of a drain side select gate SGD that was in the upper skirt of the threshold voltage distribution exceeds the upper limit value.

In view of these points, it is difficult to keep the threshold voltage of all the drain side select gates SGD between Vsgd_low and Vsgd.

Accordingly, the present embodiment utilizes the drain side dummy cell DCD<1> disposed adjacently to the drain side select gate SGD. Specifically, a comprehensive threshold voltage combining the drain side select gate SGD and the drain side dummy cell DCD<1> is kept to a desired value. Below, the drain side select gate SGD including the drain side dummy cell DCD<1> is sometimes referred to as an "assisted drain side select gate SGD'."

Figure 6:
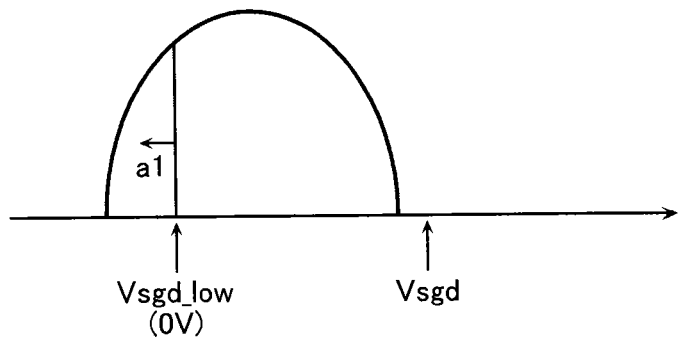
FIG. 6 is a view showing a threshold voltage distribution of a drain side select gate in the nonvolatile semiconductor memory device according to the same embodiment.

In steps S5 and S6, the threshold voltage of the drain side dummy cell DCD<1> of a NAND cell unit 4 having a drain side select gate SGD judged in step S4 to have a threshold voltage which is less than or equal to the lower limit voltage Vsgd_low, is caused to undergo a transition to the positive side. FIG. 6 is the threshold voltage distribution of the drain side select gate SGD at a time point of completion of step S4, and a NAND cell unit 4 having a drain side select gate SGD on a lower skirt side of the threshold voltage distribution indicated by the arrow a1 in FIG. 6 is a target of the present programming.

Figure 7:
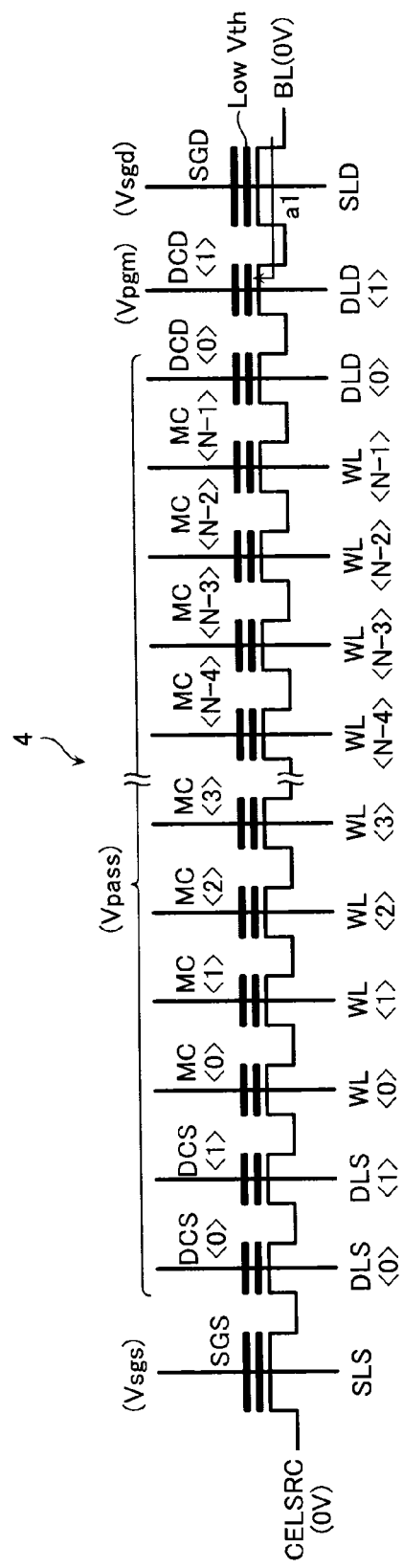
FIG. 7 is a view showing a bias state of a NAND cell unit during programming to a drain side dummy cell in the nonvolatile semiconductor memory device according to the same embodiment.
Figure 8:
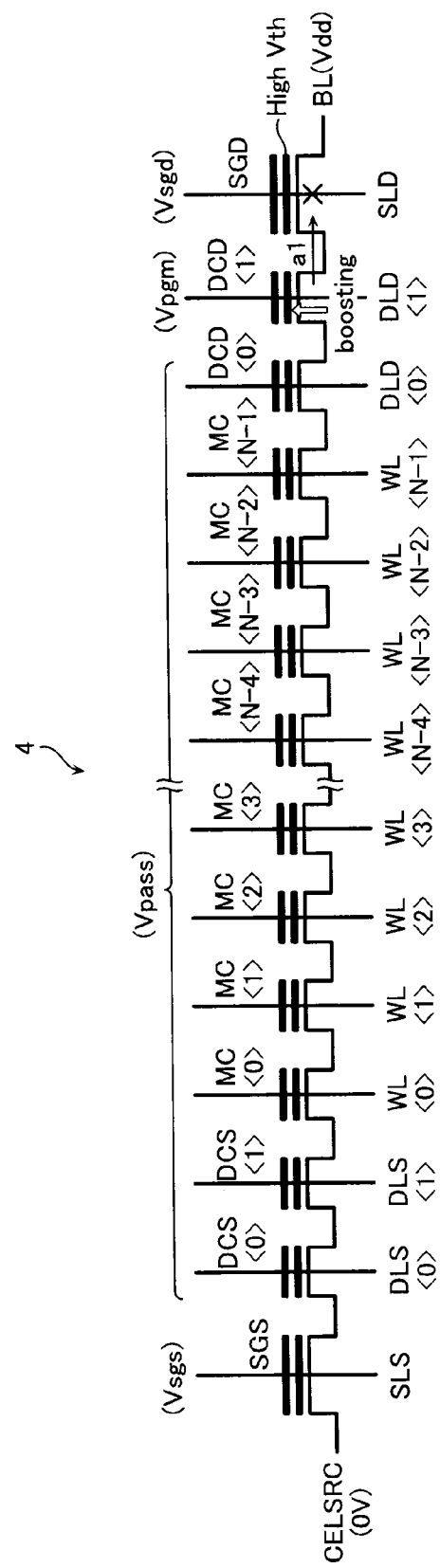
FIG. 8 is a view showing a bias state of a NAND cell unit during programming to a drain side dummy cell in the nonvolatile semiconductor memory device according to the same embodiment.

First, in step S5, it is required to change a bias state of the NAND cell unit 4 as in FIG. 7 or FIG. 8, depending on necessity or otherwise of the programming on the drain side dummy cell DCD<1>.

As shown in FIGS. 7 and 8, in step S5, the drain side dummy word line DLD<1> is applied with the write voltage Vpgm (Vpgm4 shown in FIG. 4), and the select gate lines SLS and SLD are applied with the select gate voltages Vsgs and Vsgd, and all the dummy word lines DLS and DLD and all the word lines WL are applied with the pass voltage Vpass. In addition, the source line CELSRC is charged to 0 V.

Moreover, as shown in FIG. 7, in a NAND cell unit 4 requiring programming on the drain side dummy cell DCD<1>, the bit line BL is charged to 0 V. This causes electrons to be injected into the floating gate of the drain side dummy cell DCD<1> via the drain side select gate SGD, as indicated by the arrow a1 in FIG. 7. As a result, the threshold voltage of the drain side dummy cell DCD<1> undergoes a transition to the positive side.

On the other hand, as shown in FIG. 8, in a NAND cell unit 4 not requiring programming on the drain side dummy cell DCD<1>, the bit line BL is charged to a back bias potential Vdd. In this case, because the drain side select gate SGD becomes non-conducting, a potential of the cell channel of the drain side dummy cell DCD<1> is maintained, as indicated by the arrow a1 in FIG. 8. As a result, injection of electrons to the floating gate of the drain side dummy cell DCD<1> is not performed.

Note that, as shown by the dashed-dotted line v4 in FIG. 4, the source side select gate line SLS may be applied with a voltage lower than the threshold voltage of the source side select gate SGS, for example, a voltage of 0 V, whereby the source side select gate is rendered non-conducting. In this case, since the source line CELSRC becomes electrically disconnected from the bit line BL and capacitance of the source line CELSRC can no longer be seen, it becomes easier for electron injection to the floating gate of the drain side dummy cell DCD<1> to be performed. In addition, the effort of charging the source line CELSRC to 0 V can be saved.

Moreover, in step S5 too, as shown by the dashed-dotted line v5 in FIG. 4, all the source side dummy word lines DLS and all the word lines WL may be applied with a voltage higher than the threshold voltage of the erase state of all the source side dummy cells DCS and all the memory cells MC, for example a voltage of 0 V. This is because at this time point of step S5, the threshold voltage of all the source side dummy cells DCS and all the memory cells MC is still the erase state and the dummy cells DCS and so on can be rendered conducting. In this case, the drain side dummy word line DLD<0>, in view of a relationship with the adjacent word line WL<N−1>, is applied in advance with a moderating voltage Vgp which is an intermediate voltage between the pass voltage Vpass and the write voltage Vpgm, as shown by the dashed-dotted line v6 in FIG. 4.

Following this, in the verify operation on the drain side dummy cell DCD<1> of step S6, the drain side dummy word line DLD<1> and the drain side select gate line SLD are applied with the lower limit voltage Vsgd_low of the drain side select gate SGD (Vsgd_low1 and Vsgd_low2, respectively, shown in FIG. 4), and the source side select gate SGS is applied with the select gate voltage Vsgs, and all the source side dummy word lines DLS, all the word lines WL, and the drain side dummy word line DLD<0> are applied with the read voltage Vread. Then, detection of whether a current flows in the NAND cell unit 4 is performed by the sense amplifier SA. In this step S6 too, the drain side dummy word line DLD<1> and the drain side select gate line SLD are applied with the lower limit voltage Vsgd_low, but this is for judging the comprehensive threshold voltage combining the drain side select gate SGD and the drain side dummy cell DCD<1> (assisted drain side select gate SGD').

Note that it is not necessarily required for the lower limit voltage Vsgd_low1 applied to the drain side select gate line SLD and the lower limit voltage Vsgd_low2 applied to the drain side dummy word line DLD<1> to be the same. However, the lower limit voltage Vsgd_low1 applied to the drain side select gate SGD in step S4 and the lower limit voltage Vsgd_low1 applied to the drain side select gate SGD in step S6 must be set substantially the same. Similarly, the lower limit voltage Vsgd_low2 applied to the drain side dummy word line DLD<1> in step S4 and the lower limit voltage Vsgd_low2 applied to the drain side dummy word line DLD<1> in step S6 must be set substantially the same. This is because step S4 and step S6 need to be performed under the same conditions as an actual environment of usage.

Figure 9:
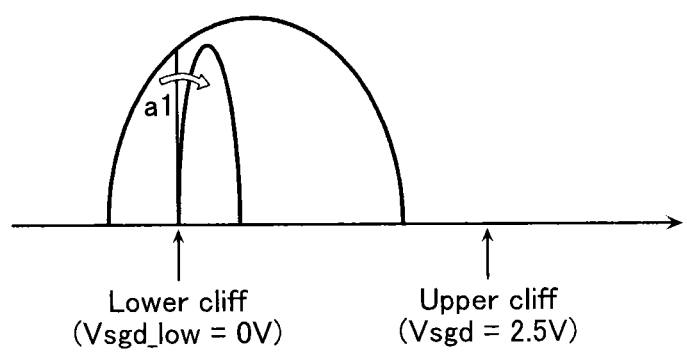
FIG. 9 is a view showing a threshold voltage distribution of a drain side select gate in the nonvolatile semiconductor memory device according to the same embodiment.

Now, if there is even one NAND cell unit 4 where the threshold voltage of the assisted drain side select gate SGD' falls below the lower limit voltage Vsgs_low, then, as shown in FIG. 4, steps S5 and S6 are repeated again after stepping up the write voltage Vpgm. Then, when all the NAND cell units 4 pass the verify operation, the threshold voltage distribution of the drain side select gate SGD becomes as in FIG. 9. In other words, as shown by the outlined arrow a1 in FIG. 9, the threshold voltage distribution of the assisted drain side select gate SGD' where the threshold voltage has fallen below the lower limit voltage Vsgd_low (for example, 0 V) undergoes a transition to above the lower limit voltage Vsgd_low.

The above-described series of the erase operation and select gate write operation enables all the source side select gates SGS and the assisted drain side select gate SGD' to be written up to the desired threshold voltage.

Next, the write operation in the case of using the assisted drain side select gate SGD' is described. Note that in the case of the present embodiment, the assisted drain side select gate SGD' is used when the threshold voltage is lower than the lower limit voltage Vsgd_low. Therefore, the write operation of data "0" that does not require the drain side select gate SGD to be set non-conducting is similar to the case of not using the assisted drain side select gate SGD', hence a description thereof is omitted.

Figure 10:
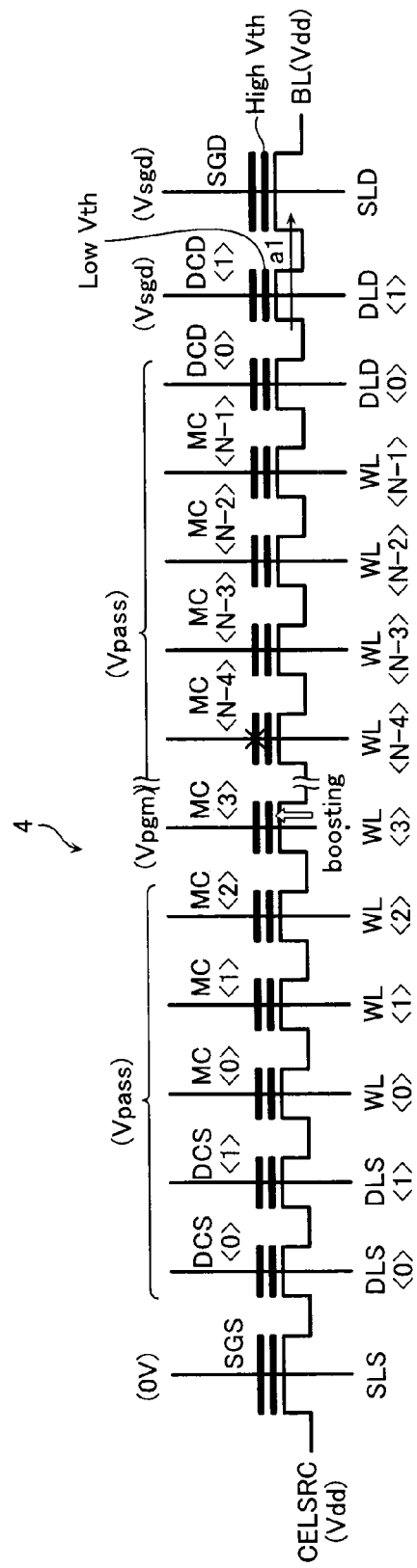
FIG. 10 is a view showing a bias state of a NAND cell unit during programming to a memory cell in the nonvolatile semiconductor memory device according to the same embodiment.
Figure 11:
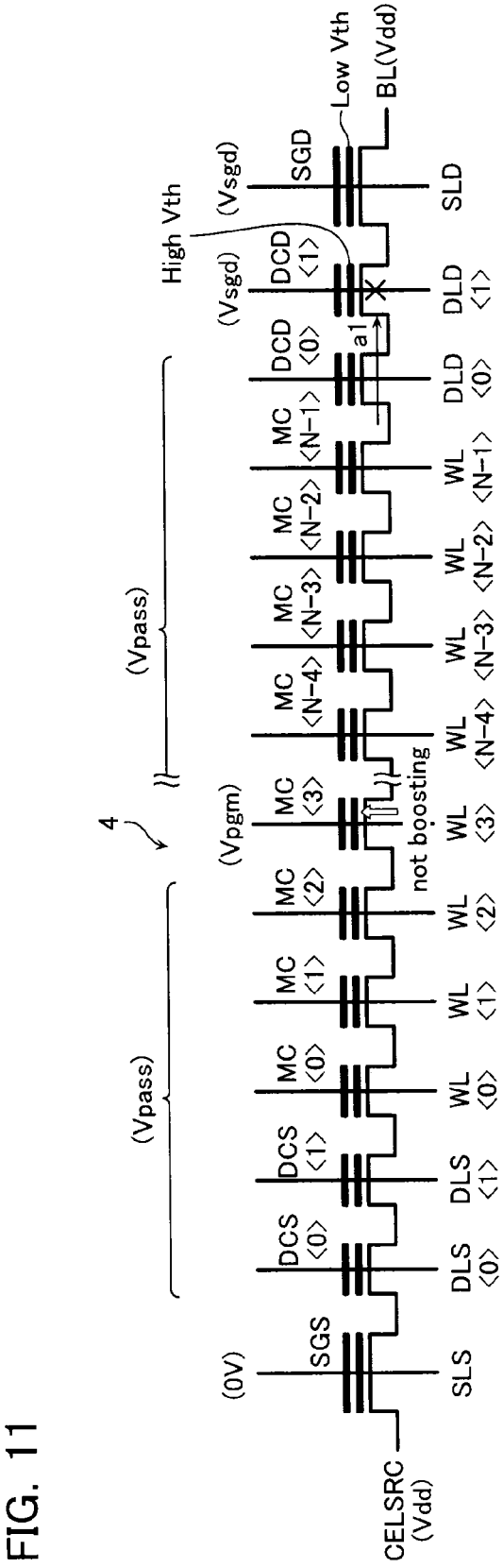
FIG. 11 is a view showing a bias state of a NAND cell unit during programming to a memory cell in the nonvolatile semiconductor memory device according to the same embodiment.

FIGS. 10 and 11 are views showing bias states of the NAND cell unit 4 during the write operation of data "0". FIG. 10 is the bias state of the NAND cell unit 4 having the desired threshold voltage by the drain side select gate SGD alone, and FIG. 11 is a bias state of the NAND cell unit 4 having the desired threshold voltage by the assisted drain side select gate SGD'.

During the write operation of data "1" (non-write), the selected word line WL is applied with the write voltage Vpgm, and the source side select gate line SLS is applied with 0 V, all the dummy word lines DLS and DLD are applied with the pass voltage Vpass, and the drain side dummy word line DLD<1> and the drain side select gate SGD are applied with the select gate voltage Vsgd. In addition, the source line CELSRC and the bit line BL are charged to the back bias potential Vdd.

As shown in FIG. 10, in the case of the NAND cell unit 4 having the desired threshold voltage by the drain side select gate SGD alone, this results in the drain side dummy cell DCD<1> where the threshold voltage is low being conducting, but the drain side select gate SGD where the threshold voltage is high being non-conducting. On the other hand, as shown in FIG. 11, in the case of the NAND cell unit 4 having the desired threshold voltage by the assisted drain side select gate SGD', this results in the drain side select gate SGD where the threshold voltage is low being conducting, but the drain side dummy cell DCD<1> where the threshold voltage is high being non-conducting. However, in whichever case, the drain side dummy cell DCD<1> and the drain side select gate SGD are non-conducting overall, hence the voltage of the cell channel of the selected memory cell MC can be held, as indicated by the arrow a1 in FIG. 10 and the arrow a1 in FIG. 11.

As indicated above, the read operation and the write operation in the case of using the assisted drain side select gate SGD' are made possible merely by creating a similar bias state to that of the case of not using the assisted drain side select gate SGD' on the NAND cell unit 4, excluding applying the drain side dummy cell DCD<1> with the same voltage as the drain side select gate line SLD.

Note that in the case of the present embodiment, before threshold voltage setting of the select gates SGS and SGD, it is required to perform the erase operation on the cell block BLK including also the memory cells MC. Accordingly, when the erase operation is performed on the cell block BLK, the threshold voltage of the select gates SGS and SGD also attains the erase state. Therefore, it should be noted that in the present embodiment, threshold voltage setting of the select gates SGS and SGD needs to be performed every erase operation.

As indicated above, the present embodiment, by employing the drain side dummy cell adjacent to the drain side select gate in an assisting manner, enables the apparent threshold voltage of the drain side select gate to be raised. Moreover, a target of the programming on the drain side dummy word line DL<1> can be selected for each NAND cell unit 4, hence variation in the drain side select gates can be absorbed. In other words, the present embodiment makes it possible to provide a nonvolatile semiconductor memory device where occurrence of mistaken write is suppressed even when employing a select gate having a planar surface cell structure requiring threshold voltage setting of small margin.

Second Embodiment

In the case of the first embodiment, it was required to perform threshold voltage setting of the select gates SGS and SGD every erase operation on the cell block BLK. However, in this case, when used in applications accompanied by frequent erase operations, setting of the threshold voltage of the select gates SGS and SGD is required each time, hence processing time ends up becoming proportionately longer. Moreover, frequent rewrite of the threshold voltage is undesirable because it hastens deterioration of the select gates SGS and SGD. Accordingly, a second embodiment describes a flash memory executing an erase operation on the cell block BLK unaccompanied by erase of the select gates SGS and SGD.

Figure 12:
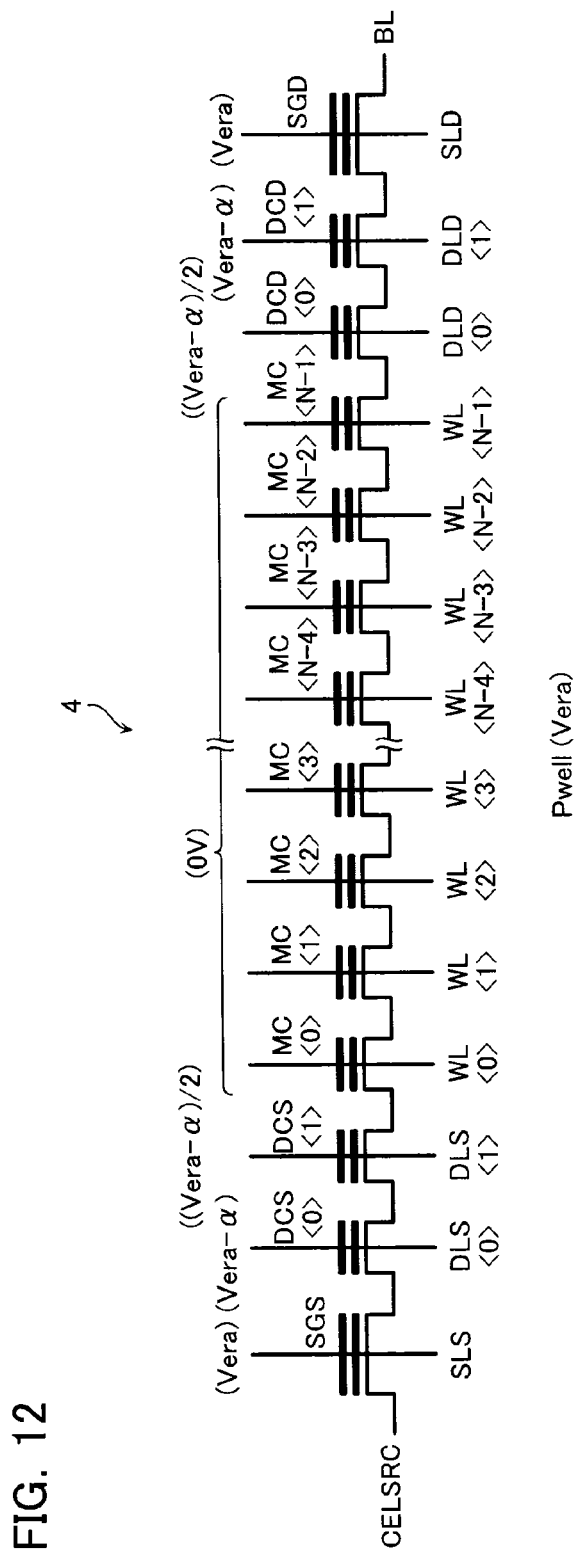
FIG. 12 is a view showing a bias state of a NAND cell unit during an erase operation in a nonvolatile semiconductor memory device according to a second embodiment.

FIG. 12 is a view showing a bias state of the NAND cell unit 4 during the erase operation in the flash memory according to the present embodiment.

In the erase operation in the present embodiment, the select gate lines SLS and SLD are applied with the erase voltage Vera configuring an erase prohibit voltage, the dummy word lines DLS<0> and DLD<1> are applied with a voltage Vera-α which is less than or equal to the erase voltage Vera configuring the erase prohibit voltage, the dummy word lines DLS<1> and DLD<0> are applied with a voltage (Vera-α)/2 which is an intermediate potential between the voltage Vera-α and 0 V, and all the word lines WL are applied with 0 V configuring an erase allow voltage. In addition, the P type well where the memory cell array 1 is formed is applied with the erase voltage Vera. This causes electrons to be released from the floating gate toward the cell channel in the memory cell MC, thereby allowing the threshold voltage of the memory cell MC to be set to the erase state. On the other hand, the select gate lines SGS and SGD are applied with the same erase voltage Vera as the cell channel, hence electrons in the floating gate are not released. Moreover, setting of an appropriate constant α also in the drain side dummy word line DLD<1> prevents release of electrons from the floating gate from taking place. Note that the constant α is set to a value that while avoiding release of electrons from the floating gate of the drain side dummy cell DCS<1>, makes it possible to relax withstand voltage between the select gates SGS and SGD and the word lines WL, for example, the constant α is set to zero. By so doing, the select gate lines SLS and SLD, and the dummy word lines DLS<0> and DLD<1> are applied with 20 V, the dummy word lines DLS<1> and DLD<0> are applied with 10 V, and the word lines WL are applied with 0 V. This setting makes it possible to avoid release of electrons from the floating gate of the select gates SGS and SGD and the dummy cell DCS<0>. Moreover, since the voltage between the select gate lines SLS and SLD and the word lines WL changes in stages by 10 V at a time, stress occurring between the select gate lines SLS and SLD and the word lines WL can be relieved.

As indicated above, employing the erase operation of the present embodiment makes it possible to avoid the threshold voltage of the select gate attaining the erase state. In other words, in the case of employing the erase operation of the present embodiment, setting of the threshold voltage of the select gates SGS and SGD described in the first embodiment need only be performed for the initial one time for subsequent setting of the threshold voltage to become unnecessary. Moreover, due to retention characteristics of the threshold voltage of the select gates, it is sometimes better for the threshold voltage of the select gates to be periodically refreshed. In this case, it is only required that normally the erase voltage described in the present embodiment is performed, and that the erase voltage described in the first embodiment is performed with a timing at which it is desired to refresh the threshold voltage of the select gates.

The following figures are examples of several voltages. Voltage of Vpgm1 is from 15V to 20V. Vpgm2 is 0V to 5V higher than Vpgm1. Vpgm3 is 0.5V to 3V lower than Vpgm2. Vpgm4 is from 17V to 22V. Vpgm5 is 0V to 5V higher than Vpgm4. Vsgd_low1 is from -2V to 2V, preferably from 0V to 1V. Vsgd_low2 is from -2V to 2V, preferably from 0V to 1V. When the difference between two voltages is 1V or less, both voltages have substantially the same voltage. When the difference between two voltages is 0.5V or less, both voltages have the same voltage.

OTHER

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
   a memory cell array including a source line, a plurality of bit lines, and a plurality of NAND cell units, the plurality of NAND cell units being each configured from a source side select gate, a plurality of memory cells, a drain side dummy cell, and a drain side select gate that are connected in series between the source line and the bit line, and the source side select gate, the plurality of memory cells, the drain side dummy cell, and the drain side select gate being each a transistor having a control gate and a charge storage layer; and
   a write/erase circuit configured to execute a select gate write operation,
   the select gate write operation
   executing a programming operation for setting a threshold voltage of the drain side select gate and a verify operation for judging whether said threshold voltage has reached a certain value, and,
   when it is judged by the verify operation on the drain side select gate that the threshold voltage of said drain side select gate has not reached the certain value, repeatedly executing a programming operation for setting a threshold voltage of the drain side dummy cell connected to said drain side select gate and a verify operation for judging whether said threshold voltage has reached a certain value, until the threshold voltage of said drain side dummy cell has reached the certain value.

2. The nonvolatile semiconductor memory device according to claim 1, wherein
   the write/erase circuit, during the verify operation on the drain side select gate and the verify operation on the drain side dummy cell, applies substantially the same gate voltage to the drain side select gate.

3. The nonvolatile semiconductor memory device according to claim 1, wherein
   the write/erase circuit, during the verify operation on the drain side select gate and the verify operation on the drain side dummy cell, applies substantially the same gate voltage to the drain side dummy cell.

4. The nonvolatile semiconductor memory device according to claim 1, wherein
   the write/erase circuit, during at least one of the verify operation on the drain side select gate and the verify operation on the drain side dummy cell, applies substantially the same gate voltage to the drain side select gate and the drain side dummy cell.

5. The nonvolatile semiconductor memory device according to claim 1, wherein
the write/erase circuit, for each one time of the select gate write program, executes the programming operation on the drain side select gate one time only.

6. The nonvolatile semiconductor memory device according to claim 1, wherein
the write/erase circuit, during at least one of the programming operation on the drain side select gate and the programming operation on the drain side dummy cell, applies to the source side select gate a gate voltage having a value which is lower than a threshold voltage of said source side select gate.

7. The nonvolatile semiconductor memory device according to claim 1, wherein
the write/erase circuit
executes an erase operation for setting a threshold voltage of the plurality of memory cells to an erase state, and
executes the select gate write operation following the erase operation.

8. The nonvolatile semiconductor memory device according to claim 7, wherein
the write/erase circuit, for each execution of the erase operation, executes the select gate write operation.

9. The nonvolatile semiconductor memory device according to claim 1, wherein
the write/erase circuit
executes an erase operation for setting a threshold voltage of the plurality of memory cells to an erase state, and
during the erase operation, applies as a gate voltage to the drain side select gate an erase prohibit voltage for prohibiting the threshold voltage of the drain side select gate from being set to the erase state, applies as a gate voltage to the plurality of memory cells an erase allow voltage for allowing a threshold voltage of the plurality of memory cells to be set to the erase state, and applies as a gate voltage to the drain side dummy cell an intermediate voltage between the erase prohibit voltage and the erase allow voltage.

10. The nonvolatile semiconductor memory device according to claim 1, wherein
the NAND cell unit of the memory cell array includes a plurality of the drain side dummy cells.

11. The nonvolatile semiconductor memory device according to claim 1, wherein
the write/erase circuit, during the programming operation on the drain side select gate, applies to the plurality of memory cells and the drain side dummy cell a gate voltage which is higher than a threshold voltage of an erase state of said plurality of memory cells and said drain side dummy cell, respectively.

12. The nonvolatile semiconductor memory device according to claim 1, wherein
the write/erase circuit, during the programming operation on the drain side dummy cell, applies to the plurality of memory cells a gate voltage which is higher than a threshold voltage of an erase state of said plurality of memory cells.

13. A nonvolatile semiconductor memory device, comprising:
a memory cell array including a source line, a plurality of bit lines, and a plurality of NAND cell units, the plurality of NAND cell units being each configured from a source side select gate, a plurality of memory cells, a drain side dummy cell, and a drain side select gate that are connected in series between the source line and the bit line, and the source side select gate, the plurality of memory cells, the drain side dummy cell, and the drain side select gate being each a transistor that has a control gate and a charge storage layer; and
a write/erase circuit configured to execute a select gate write operation,
the select gate write operation
executing a programming operation for setting a threshold voltage of the source side select gate and a verify operation for judging whether said threshold voltage has reached a certain value, until said threshold voltage has reached the certain value,
executing a programming operation for setting a threshold voltage of the drain side select gate and a verify operation for judging whether said threshold voltage has reached a certain value, and,
when it is judged by the verify operation on the drain side select gate that the threshold voltage of said drain side select gate has not reached the certain value, repeatedly executing a programming operation for setting a threshold voltage of the drain side dummy cell connected to said drain side select gate and a verify operation for judging whether said threshold voltage has reached a certain value, until the threshold voltage of said drain side dummy cell has reached the certain value.

14. The nonvolatile semiconductor memory device according to claim 13, wherein
the write/erase circuit, during the verify operation on the drain side select gate and the verify operation on the drain side dummy cell, applies substantially the same gate voltage to the drain side select gate.

15. The nonvolatile semiconductor memory device according to claim 13, wherein
the write/erase circuit, during the verify operation on the drain side select gate and the verify operation on the drain side dummy cell, applies substantially the same gate voltage to the drain side dummy cell.

16. The nonvolatile semiconductor memory device according to claim 13, wherein
the write/erase circuit, during at least one of the verify operation on the drain side select gate and the verify operation on the drain side dummy cell, applies substantially the same gate voltage to the drain side select gate and the drain side dummy cell.

17. The nonvolatile semiconductor memory device according to claim 13, wherein
the write/erase circuit executes the programming operation on the drain side select gate one time only for one time of the select gate write program.

18. The nonvolatile semiconductor memory device according to claim 13, wherein
the write/erase circuit, during the programming operation on the source side select gate, applies to the drain side select gate, the drain side dummy cell, and the plurality of memory cells a gate voltage having a value which is higher than a threshold voltage of said drain side select gate, said drain side dummy cell, and said plurality of memory cells, respectively.

19. The nonvolatile semiconductor memory device according to claim 13, wherein
the write/erase circuit, during the programming operation on the source side select gate, applies to the drain side select gate, the drain side dummy cell, and the plurality of memory cells a gate voltage having a value which is lower than a threshold voltage of said drain side select gate, said drain side dummy cell, and said plurality of memory cells, respectively.

20. The nonvolatile semiconductor memory device according to claim 13, wherein
the write/erase circuit, during the programming operation on the drain side select gate, applies to said drain side select gate a gate voltage which is lower than a gate voltage applied to the source side select gate during the programming operation on the source side select gate.

* * * * *